(12) United States Patent
Tian et al.

(10) Patent No.: US 12,175,789 B2
(45) Date of Patent: Dec. 24, 2024

(54) MODULE INTEGRATED WITH OPTICAL SENSOR, DISPLAY PANEL, AND DISPLAY APPARATUS

(71) Applicant: Honor Device Co., Ltd., Shenzhen (CN)

(72) Inventors: Zheng Tian, Shenzhen (CN); Yabin An, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/262,639

(22) PCT Filed: Aug. 18, 2022

(86) PCT No.: PCT/CN2022/113332
§ 371 (c)(1),
(2) Date: Jul. 24, 2023

(87) PCT Pub. No.: WO2023/071445
PCT Pub. Date: May 4, 2023

(65) Prior Publication Data
US 2024/0304024 A1   Sep. 12, 2024

(30) Foreign Application Priority Data

Oct. 28, 2021   (CN) .......................... 202111264791.5

(51) Int. Cl.
*G06V 40/13* (2022.01)
*G02B 6/42* (2006.01)
(52) U.S. Cl.
CPC ........... *G06V 40/1318* (2022.01); *G02B 6/42* (2013.01)

(58) Field of Classification Search
CPC .... G06V 40/1318; G02B 6/42; G02B 6/4298; G02B 6/0011; G02B 6/0013;
(Continued)

(56) References Cited

U.S. PATENT DOCUMENTS

| 9,429,513 B2 | 8/2016 | Adachi et al. |
| 10,528,788 B2 | 1/2020 | Ling et al. |

(Continued)

FOREIGN PATENT DOCUMENTS

| CN | 101620025 A | 1/2010 |
| CN | 102644890 A | 8/2012 |

(Continued)

OTHER PUBLICATIONS

Xu, G., et al., "Design of Ambient Light Sensor Arrangement of Auto-Dimming System for Aircraft Cockpit," Aircraft Design, vol. 33 No. 2, Apr. 15, 2013, 5 Pages. (with English abstract).

(Continued)

*Primary Examiner* — Abhishek Sarma
(74) *Attorney, Agent, or Firm* — Conley Rose, P.C.

(57) ABSTRACT

A module integrated with an optical sensor, a display panel, and a display apparatus. A light guide plate and the optical sensor are arranged in a thickness direction. A first part of the light guide plate at least partially overlaps the optical sensor in the thickness direction, and a second part does not overlap the optical sensor. A surface that is of the first part and that is away from the optical sensor is a first protrusion structure, and an included angle between at least a partial side edge of the second part and the thickness direction is greater than 0°. In the embodiments of this application, the second part that protrudes from the optical sensor may receive an optical signal around the optical sensor, and enable the optical signal to be totally reflected inside the light guide plate.

20 Claims, 12 Drawing Sheets

(58) Field of Classification Search
CPC .... G02B 6/0015; G02B 6/002; G02B 6/0023; G02B 6/0031; G02B 6/0033; G02B 6/0035; G02B 6/0045; G06F 3/042; H10K 59/60; H10K 39/601; H10K 59/65
See application file for complete search history.

(56) References Cited

U.S. PATENT DOCUMENTS

| | | |
|---|---|---|
| 11,150,505 B2 | 10/2021 | Ling et al. |
| 11,908,226 B2 | 2/2024 | Feng et al. |
| 2013/0258710 A1* | 10/2013 | Huang .............. G02F 1/133608 |
| | | 362/609 |
| 2019/0267419 A1 | 8/2019 | Shen |
| 2021/0406496 A1* | 12/2021 | Tao .................... G06V 40/1376 |
| 2023/0324245 A1 | 10/2023 | An et al. |

FOREIGN PATENT DOCUMENTS

| | | |
|---|---|---|
| CN | 205880271 U | 1/2017 |
| CN | 106951816 A | 7/2017 |
| CN | 108258017 A | 7/2018 |
| CN | 109447046 A | 3/2019 |
| CN | 109618025 A | 4/2019 |
| CN | 110515231 A | 11/2019 |
| CN | 111965897 A | 11/2020 |
| CN | 112485947 A | 3/2021 |
| CN | 213210660 U | 5/2021 |
| CN | 113296314 A | 8/2021 |
| CN | 113301190 A | 8/2021 |
| JP | 2015108611 A | 6/2015 |
| WO | 2018127101 A1 | 7/2018 |
| WO | 2021042283 A1 | 3/2021 |

OTHER PUBLICATIONS

Zhang, Z., et al., "Study on the layout and light uniformity of the scattering dots of the light guide plate," Optical Technique, vol. 46 No. 2, Mar. 15, 2020, 6 Pages. (with English abstract).

* cited by examiner

MODULE INTEGRATED WITH OPTICAL SENSOR, DISPLAY PANEL, AND DISPLAY APPARATUS

CROSS-REFERENCE TO RELATED APPLICATIONS

This application is a U.S. National Stage of International Application No. PCT/CN2022/113332 filed on Aug. 18, 2022, which claims priority to Chinese Patent Application No. 202111264791.5, filed with the China National Intellectual Property Administration on Oct. 28, 2021, both of which are incorporated herein by reference in their entireties.

TECHNICAL FIELD

This application relates to the sensor field, and specifically, to a module integrated with an optical sensor, a display panel, and a display apparatus.

BACKGROUND

In the optical sensor field, a quantity of signals received by an optical sensor directly affects optical feature recognition accuracy of the optical sensor. Currently, a degree of integration is increasingly higher, integrating an optical sensor into an apparatus with another function has been a conventional means. However, when the optical sensor is integrated into the apparatus with another function, a quantity of optical signals received by the optical sensor is affected by more other structures, and directly affects optical feature recognition accuracy.

For example, in the display field, an optical sensor is integrated into a display panel, to implement biometric feature recognition (for example, fingerprint recognition or facial recognition), proximity light detection, ambient light detection, or the like. However, a line and a device related to light emission inside the display panel severely hinder the optical sensor from receiving an optical signal.

Therefore, how to improve optical feature recognition accuracy of an apparatus integrated with an optical sensor is still an urgent problem to be resolved.

SUMMARY

In view of this, this application provides a module integrated with an optical sensor, a display panel, and a display apparatus.

According to a first aspect, this application provides a module integrated with an optical sensor, including:
  at least one optical sensor, where the optical sensor receives an optical signal from a first side of the module; and
  at least one light guide plate, where the light guide plate and the optical sensor are arranged in a thickness direction of the module, and the light guide plate is disposed on a side that is of the optical sensor and that is away from the first side, where
  the light guide plate includes a first part and a second part; and in the thickness direction of the module, the first part at least partially overlaps the optical sensor, and the second part does not overlap the optical sensor; and
  a surface that is of the first part and that is away from the optical sensor is a first protrusion structure, and an included angle between at least a partial side edge of the second part and the thickness direction of the module is greater than 0°.

In an implementation of the first aspect, at least two second protrusion structures are included on a side that is of the first part and that is close to the optical sensor.

In an implementation of the first aspect, the module includes a plurality of optical sensors; and in the thickness direction of the module, the light guide plate covers at least two optical sensors;
  the light guide plate further includes a third part; and in the thickness direction of the module, the third part covers an area between the at least two optical sensors; and
  the first protrusion structure does not overlap the third part in the thickness direction of the module.

In an implementation of the first aspect, the module includes a plurality of optical sensors and a plurality of light guide plates, and the optical sensors and the light guide plates are disposed in a one-to-one correspondence.

In an implementation of the first aspect, in the optical sensor and the light guide plate that are correspondingly disposed, a projection of the second part surrounds a projection of the optical sensor in the thickness direction of the module; and an included angle between each side edge of the second part and the thickness direction of the module is greater than 0°.

In an implementation of the first aspect, the optical sensor is a thin film transistor device, and a gate of the thin film transistor device is located on a side that is of the optical sensor and that is away from the light guide plate.

In an implementation of the first aspect, the optical sensor is at least one of an organic photosensitive device and a photodiode device.

According to a second aspect, this application provides a display panel, including a display area and a non-display area. The non-display area surrounds the display area, and at least one of the display area and the non-display area includes:
  at least one optical sensor, where the optical sensor receives an optical signal from a first side of the display panel; and
  at least one light guide plate, where the light guide plate and the optical sensor are arranged in a thickness direction of the display panel, and the light guide plate is disposed on a side that is of the optical sensor and that is away from the first side, where
  the light guide plate includes a first part and a second part; and in the thickness direction of the display panel, the first part at least partially overlaps the optical sensor, and the second part does not overlap the optical sensor; and
  a surface that is of the first part and that is away from the optical sensor is a first protrusion structure, and an included angle between at least a partial side edge of the second part and the thickness direction of the display panel is greater than 0°.

In an implementation of the second aspect, at least two second protrusion structures are included on a side that is of the first part and that is close to the optical sensor.

In an implementation of the second aspect, the non-display area includes a plurality of optical sensors:
  in the thickness direction of the display panel, the light guide plate covers at least two optical sensors located on two opposite sides of the display area;

the light guide plate further includes a third part, and at least a part of the third part is located in the display area; and in the thickness direction of the display panel, the first protrusion structure does not overlap the third part located in the display area.

In an implementation of the second aspect, the display panel includes a plurality of optical sensors and a plurality of light guide plates, and the optical sensors and the light guide plates are disposed in a one-to-one correspondence.

In an implementation of the second aspect, in the optical sensor and the light guide plate that are correspondingly disposed, a projection of the second part surrounds a projection of the optical sensor in the thickness direction of the display panel, and an included angle between each side edge of the second part and the thickness direction of the display panel is greater than 0°.

In an implementation of the second aspect, the non-display area includes at least one optical sensor and at least one light guide plate; and a side edge that is of the light guide plate disposed in the non-display area and that is close to the display area is parallel to the thickness direction of the display panel.

In an implementation of the second aspect, the display area includes the optical sensor, and the optical sensor located in the display area is configured to perform biometric feature recognition.

In an implementation of the second aspect, the optical sensor is a thin film transistor device, and a gate of the thin film transistor device is located on a side that is of an active layer and that is away from the light guide plate.

In an implementation of the second aspect, the optical sensor is at least one of an organic photosensitive device and a photodiode device.

According to a third aspect, this application provides a display apparatus, including the display panel provided in the second aspect.

In the module integrated with an optical sensor, the display panel, and the display apparatus that are provided in the embodiments of this application, the light guide plate that is located on the optical sensor and that is away from a side on which an optical signal is received includes the first part and the second part. The second part that protrudes from the optical sensor may receive an optical signal around the optical sensor, and enable the optical signal to be totally reflected inside the light guide plate. The first part that is blocked by the optical sensor may enable the optical signal inside the light guide plate to be emitted by the light guide plate after a total reflection path of the optical signal inside the light guide plate is changed, and to mainly arrive at the optical sensor. In the embodiments of this application, the light guide plate is disposed below the optical sensor, and the light guide plate is specially designed, so that intensity of an optical signal received by the optical sensor can be increased, and optical feature recognition precision of the module, the display panel, and the display apparatus can be increased.

BRIEF DESCRIPTION OF DRAWINGS

To describe the technical solutions m embodiments of this application more clearly, the following briefly describes the accompanying drawings that need to be used by the embodiments. It is clear that, the accompanying drawings in the following descriptions show merely some embodiments of this application, and a person of ordinary skill in the art may still derive other drawings from these accompanying drawings without creative efforts.

DESCRIPTION OF EMBODIMENTS

To better understand the technical solutions of this application, the following describes embodiments of this application in detail with reference to the accompanying drawings.

It should be noted that the described embodiments are merely some but not all of embodiments of this application. Based on embodiments of this application, all other embodiments obtained by a person of ordinary skill in the art without creative efforts fall within the protection scope of this application.

Terms used in embodiments of this application are merely for the purpose of describing specific embodiments, but are not intended to limit this application. Terms "a", "the", and "this" in singular forms in embodiments of this application and the appended claims are also intended to include plural forms, unless otherwise stated in the context clearly.

It should be understood that the term "and/or" used in this specification is merely an association relationship for describing associated objects, and indicates that there may be three relationships. For example, A and/or B may indicate the following three cases: Only A exists, both A and B exist, and only B exists. In addition, the character "/" in this specification usually indicates an "or" relationship between the associated objects.

Figure 1:
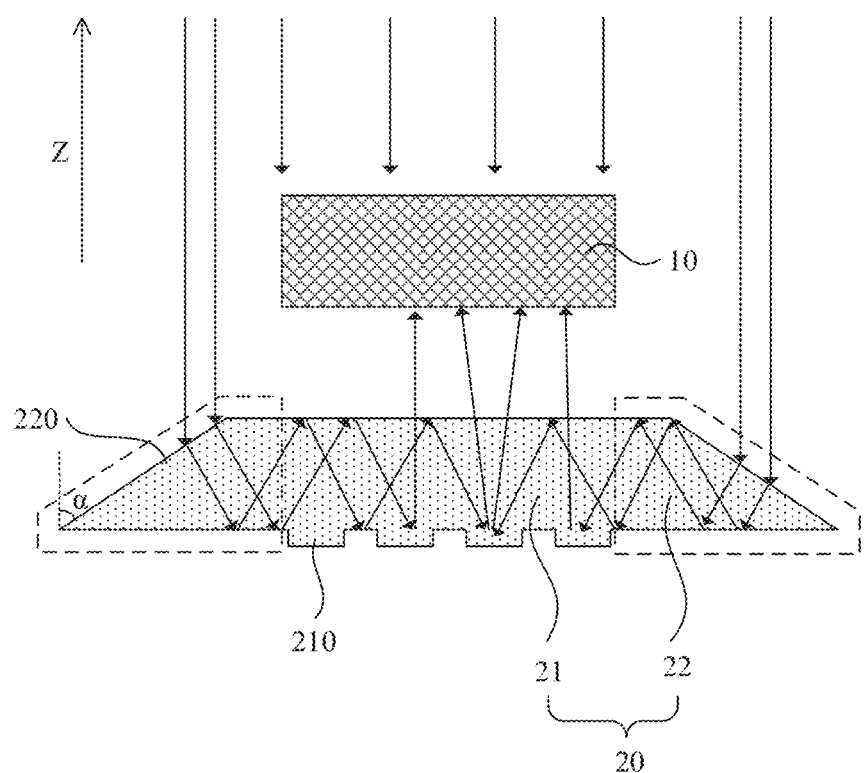
FIG. 1 is a schematic diagram of a module integrated with an optical sensor according to an embodiment of this application.

FIG. 1 is a schematic diagram of a module integrated with an optical sensor according to an embodiment of this application.

As shown in FIG. 1, the module integrated with the optical sensor 10 provided in this embodiment of this application includes at least one optical sensor 10 and at least one light guide plate 20. The light guide plate 20 and the optical sensor 10 are arranged in a thickness direction Z of the module.

The optical sensor 10 receives an optical signal from a first side of the module, and the light guide plate 20 is disposed on a side that is of the optical sensor 10 and that is away from the first side. For example, as shown in FIG. 1, an upper side of the module is the first side of the module, and the optical sensor 10 receives an optical signal transmitted from the upper side, and the light guide plate 20 is disposed on a lower side of the optical sensor 10.

In this embodiment of this application, the optical signal is a signal that is to be transmitted to the optical sensor 10 and that is to be converted by the optical sensor 10 into an electrical signal, to implement optical feature recognition, and may be specifically near-infrared light, infrared light, visible light, ultraviolet light, or the like.

The light guide plate 20 includes a first part 21 and a second part 22. To be specific, the light guide plate 20 is a continuous whole, and the light guide plate 20 is divided into the first part 21 and the second part 22 based on different locations of the light guide plate 20 and the optical sensor 10.

The second part 22 does not overlap the optical sensor 10 in the thickness direction Z of the module. In other words, the second part 22 is a part protruding from the optical sensor 10. In addition, an included angle between at least a partial side edge 220 of the second part 22 and the thickness direction Z of the module is α, and α>0°. The second part 22 is configured to receive an optical signal that is from the first side of the module and that is around the optical sensor 10. In addition, a tilt angle of the partial side edge 220 of the second part 22 is set to match a refractive index of the light guide plate 20, to convert the received optical signal into light that can be totally reflected inside the light guide plate 20.

The light guide plate 20 is a material with a high refractive index. For example, when the light guide plate 20 is made of an acrylic material, the refractive index of the light guide plate 20 is 1.491. Based on a refractive index formula, when an optical signal that is incident on the light guide plate 20 is totally reflected inside the light guide plate 20, an incident angle of the optical signal needs to be greater than 41.8°. Based on this, the tilt angle of the at least partial side edge 220 of the second part 22 may be set.

The first part 21 at least partially overlaps the optical sensor 10 in the thickness direction Z of the module. In other words, at least a part of the first part 21 is blocked by the optical sensor 10. In addition, a surface that is of the first part 21 and that is away from the optical sensor 10 is a first protrusion structure 210. The first protrusion structure 210 may change a transmission path of light that is totally reflected inside the light guide plate 20. In other words, the first protrusion structure 210 may damage total reflection of the light inside the light guide plate 20, so that the light is emitted by the light guide plate 20. In addition, because the surface that is of the first part 21 and that is away from the optical sensor 10 is provided with the first protrusion structure 210, the optical signal whose transmission path is damaged inside the light guide plate 20 is mainly emitted from a surface that is of the first part 21 and that is close to the optical sensor 10, and mainly arrives at the optical sensor 10.

The first protrusion structure 210 may be specifically a printed white dot or an injection-molded small raised point.

In this embodiment of this application, the second part 22 that protrudes from the optical sensor 10 may receive an optical signal around the optical sensor 10, and enable the optical signal to be totally reflected inside the light guide plate 20. The first part 21 that is blocked by the optical sensor 10 may enable the optical signal inside the light guide plate 20 to be emitted by the light guide plate 20 after a total reflection path of the optical signal inside the light guide plate 20 is changed, and to mainly arrive at the optical sensor 10. In this embodiment of this application, the light guide plate 20 is disposed below the optical sensor 10, and the light guide plate 20 is specially designed, so that intensity of an optical signal received by the optical sensor 10 can be increased, and optical feature recognition precision of the module can be increased.

In an embodiment of this application, as shown in FIG. 1, the first protrusion structure 210 is disposed on only the first part 21 that overlaps the optical sensor 10, and the first protrusion structure 210 is disposed on the surface that is of the first part 21 and that is away from the optical sensor 10. In this case, an optical signal received by the light guide plate 20 may be emitted from an area that is of the light guide plate 20 and that corresponds to the optical sensor 10, to effectively increase a signal quantity of optical signals received by the optical sensor 10.

Figure 2:
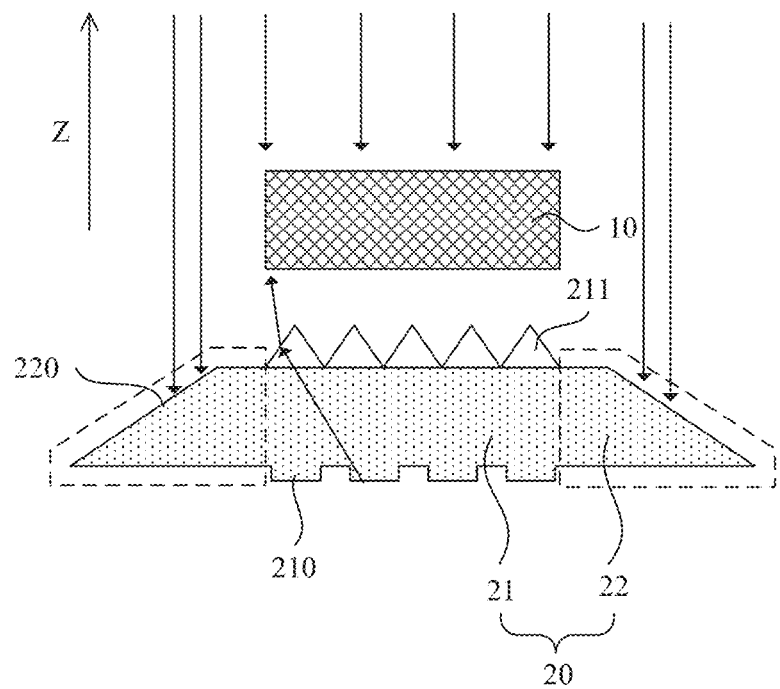
FIG. 2 is a schematic diagram of another module integrated with an optical sensor according to an embodiment of this application.

FIG. 2 is a schematic diagram of another module integrated with an optical sensor 10 according to an embodiment of this application.

In an embodiment of this application, as shown in FIG. 2, at least two second protrusion structures 211 are included on a side that is of a first part 21 and that is close to the optical sensor 10. Large-angle light exists in an optical signal that is transmitted inside a light guide plate 20 and whose total reflection path is damaged by a first protrusion structure 210. The second protrusion structure 211 may change an emission angle of the large-angle light, so that more light emitted by the light guide plate 20 is incident on the optical sensor 10.

In other words, the second protrusion structure 211 may change a transmission path of a received optical signal, to specifically enable an emergent angle of the optical signal to be less than an incident angle. The second protrusion structure 211 may be a prism structure such as a tapered structure or a hemispherical structure. The second protrusion structure 211 may be made of acrylic resin.

It should be noted that, in this embodiment of this application, the first protrusion structure 210 may be a part of the light guide plate 20. To be specific, the first protrusion structure 210 is obtained by designing a surface that is of the first part 21 and that is away from the optical sensor 10. The second protrusion structure 211 may alternatively be a part of the light guide plate 20. To be specific, the second protrusion structure 211 is obtained by designing a surface that is of the first part 21 and that is close to the optical sensor 10. In addition, the second protrusion structure 211 may alternatively be a structure different from the light guide plate 20. To be specific, the second protrusion structure 211 is additionally disposed on an upper surface that is of the light guide plate 20 and that is close to the optical sensor 10.

Figure 3:
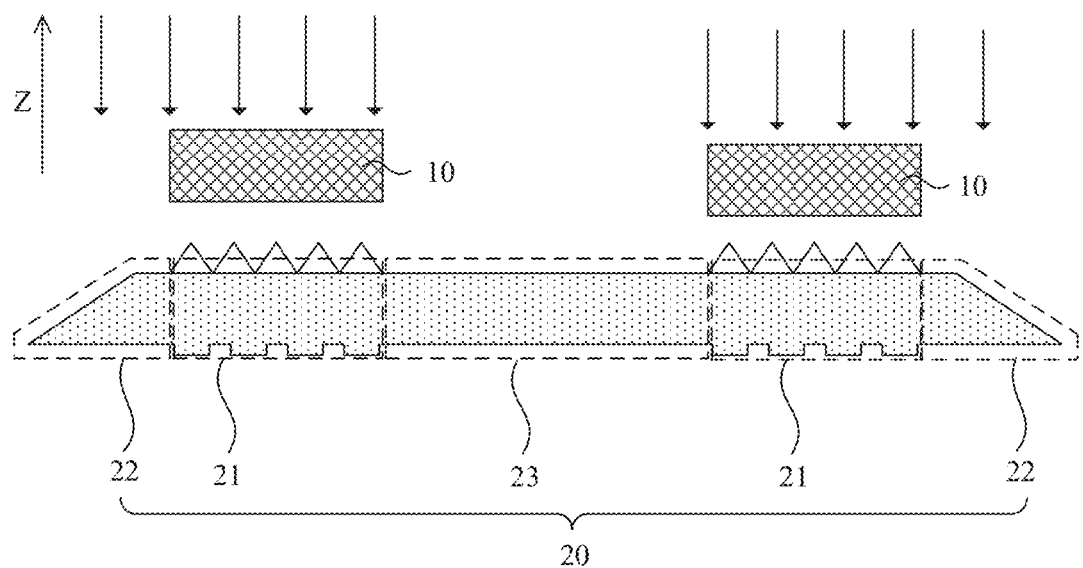
FIG. 3 is a schematic diagram of still another module integrated with an optical sensor according to an embodiment of this application.

FIG. 3 is a schematic diagram of still another module integrated with an optical sensor 10 according to an embodiment of this application.

In an embodiment of this application, as shown in FIG. 3, the module includes a plurality of optical sensors 10, and a light guide plate 20 covers at least two optical sensors 10 in a thickness direction Z of the module. In other words, one light guide plate 20 corresponds to at least two optical sensors 10.

In this embodiment, the light guide plate 20 further includes a third part 23. The third part 23 covers an area between the at least two optical sensors 10 in the thickness direction of the module. In other words, the third part 23 of the light guide plate 20 is a part located between adjacent first parts 21 that belong to a same light guide plate 20.

The first protrusion structure 210 does not overlap the third part 23 in the thickness direction Z of the module. In other words, the first protrusion structure 210 is not disposed on a third part 23 that is of the light guide plate 20 and that is located between adjacent optical sensors 10, to prevent an optical signal received by the light guide plate 20 from being emitted by the light guide plate 20 from an area in which no optical sensor 10 is disposed.

It can be understood that when the light guide plate 20 covers the at least two optical sensors 10, the light guide plate 20 that covers the at least two optical sensors 10 includes at least two first parts 21, and one optical sensor 10 corresponds to one first part 21.

In an implementation of this embodiment, the module includes one light guide plate 20, and the light guide plate 20 may be an entire-surface structure that covers all optical sensors 10.

Figure 4:
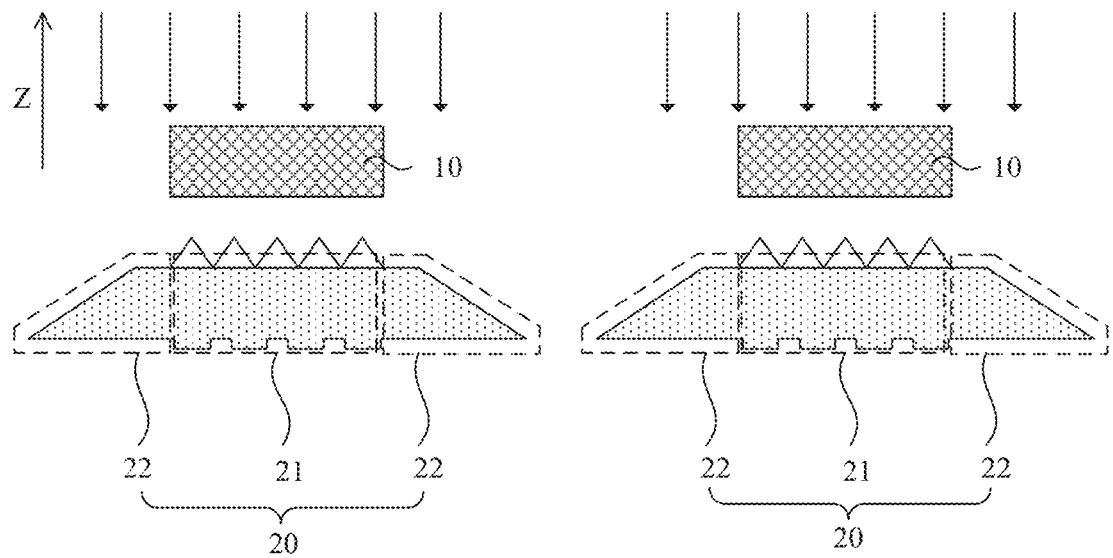
FIG. 4 is a schematic diagram of yet another module integrated with an optical sensor according to an embodiment of this application.

FIG. 4 is a schematic diagram of yet another module integrated with an optical sensor 10 according to an embodiment of this application.

In another embodiment of this application, as shown in FIG. 4, the module includes a plurality of optical sensors 10 and a plurality of light guide plates 20, and the optical sensors 10 and the light guide plates 20 are disposed in a one-to-one correspondence.

In an implementation of this embodiment, as shown in FIG. 4, in the optical sensor 10 and the light guide plate 20 that are correspondingly disposed, a projection of the second part 22 surrounds a projection of the optical sensor 10 in the thickness direction Z of the module, and an included angle between each side edge 220 of the second part 22 and the thickness direction Z of the module is greater than 0°. In other words, all optical signals around the optical sensor 10 may arrive at the light guide plate 20, and are received and used by the light guide plate 20.

In still another embodiment of this application, the module includes a plurality of optical sensors 10 and a plurality of light guide plates 20. In addition, at least one of the light guide plates 20 covers at least two optical sensors 10 in a thickness direction Z of the module, and the at least one of the light guide plates 20 is disposed in a one-to-one correspondence with the optical sensors 10.

Figure 5:
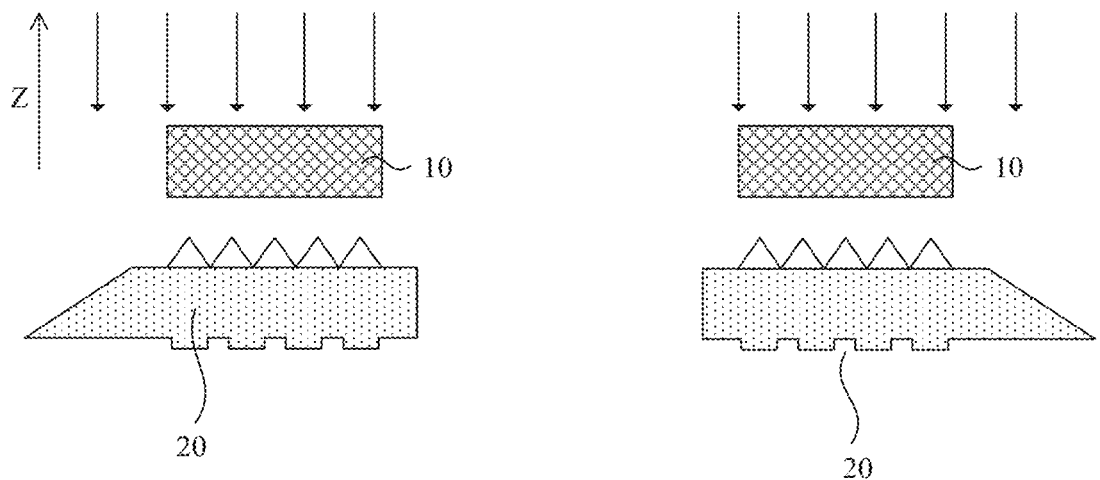
FIG. 5 is a schematic diagram of still yet another module integrated with an optical sensor according to an embodiment of this application.

FIG. 5 is a schematic diagram of still yet another module integrated with an optical sensor 10 according to an embodiment of this application.

In an embodiment of this application, as shown in FIG. 5, when the module includes at least two optical sensors 10, the two optical sensors 10 are disposed adjacent to each other and correspond to different light guide plates 20. In the two light guide plates 20, an included angle between a thickness direction Z of the module and a side edge that is of one light guide plate 20 and that is close to the other light guide plate 20 is basically equal to 0°. In other words, in a process error range, an included angle between the thickness direction Z of the module and a side edge located between two light guide plates 20 in side edges of the two light guide plates 20 that are disposed adjacent to each other is basically 0°. For example, as shown in FIG. 5, a right side edge of a left light guide plate 20 is a side edge close to a right light guide plate 20, and the side edge is basically parallel to the thickness direction Z of the module; and a left side edge of the right light guide plate 20 is a side edge close to the left light guide plate 20, and the side edge is also basically parallel to the thickness direction Z of the module. In this way, crosstalk between optical signals above different optical sensors 10 can be avoided.

Figure 6:
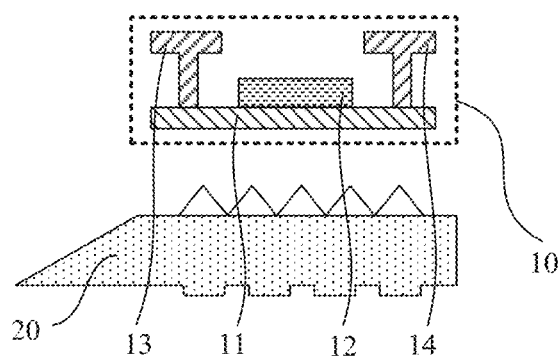
FIG. 6 is a schematic diagram of an optical sensor and a light guide plate according to an embodiment of this application.

FIG. 6 is a schematic diagram of an optical sensor 10 and a light guide plate 20 according to an embodiment of this application.

In an embodiment of this application, as shown in FIG. 6, the optical sensor 10 is a thin film transistor device, and the optical sensor 10 includes an active layer 11, a gate 12, a source 13, and a drain 14. The active layer 11 may generate different carrier concentrations based on a quantity of received optical signals, so that the optical sensor 10 generates different electrical signals, to implement optical feature recognition. The active layer 11 may be specifically at least one of an amorphous silicon film, a polycrystalline silicon film, or a metal oxide semiconductor layer.

In an implementation of this embodiment, the gate 12 of the thin film transistor device that serves as the optical sensor 10 is located on a side that is of the optical sensor 10 and that is away from the light guide plate 20. In other words, the gate 12 of the thin film transistor device that serves as the optical sensor 10 is located on a side that is of the active layer and that receives an optical signal. In this case, the gate 12 blocks the optical signal, and a quantity of optical signals received by the optical sensor 10 is affected. In this implementation, an inventive concept of this application is used. To be specific, the light guide plate 20 provided in any one of the foregoing embodiments is disposed below the optical sensor 10, to significantly increase a quantity of optical signals of a structure of the optical sensor 10.

In this embodiment of this application, the gate 12 of the thin film transistor device that serves as the optical sensor 10 may be disposed in contact with the active layer 11 of the thin film transistor device. In other words, no insulation layer is disposed between the gate 12 and the active layer 11.

In another embodiment of this application, the optical sensor 10 may alternatively be at least one of an organic photosensitive device and a photodiode device.

Figure 7:
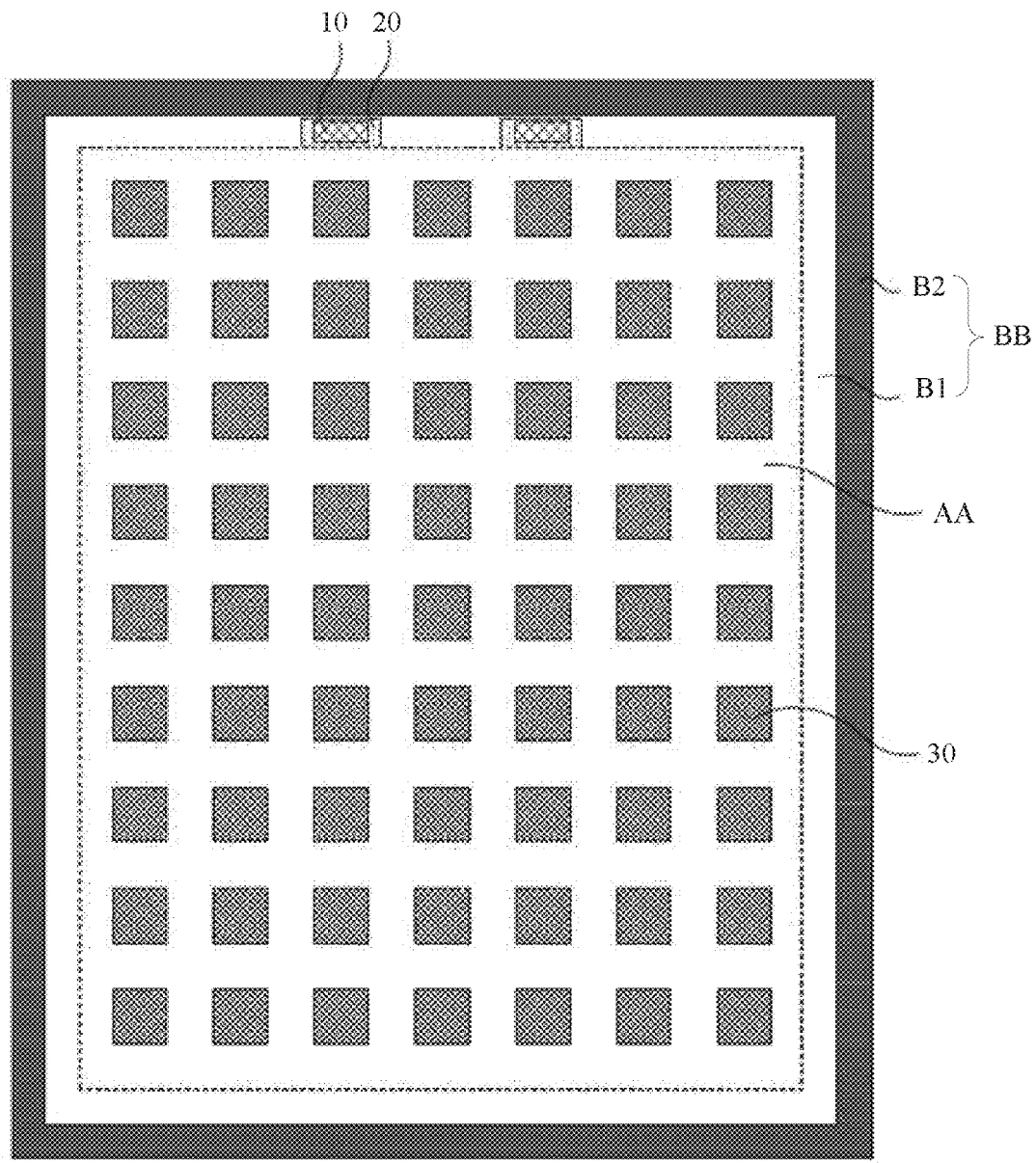
FIG. 7 is a schematic diagram of a display panel according to an embodiment of this application.
Figure 8:
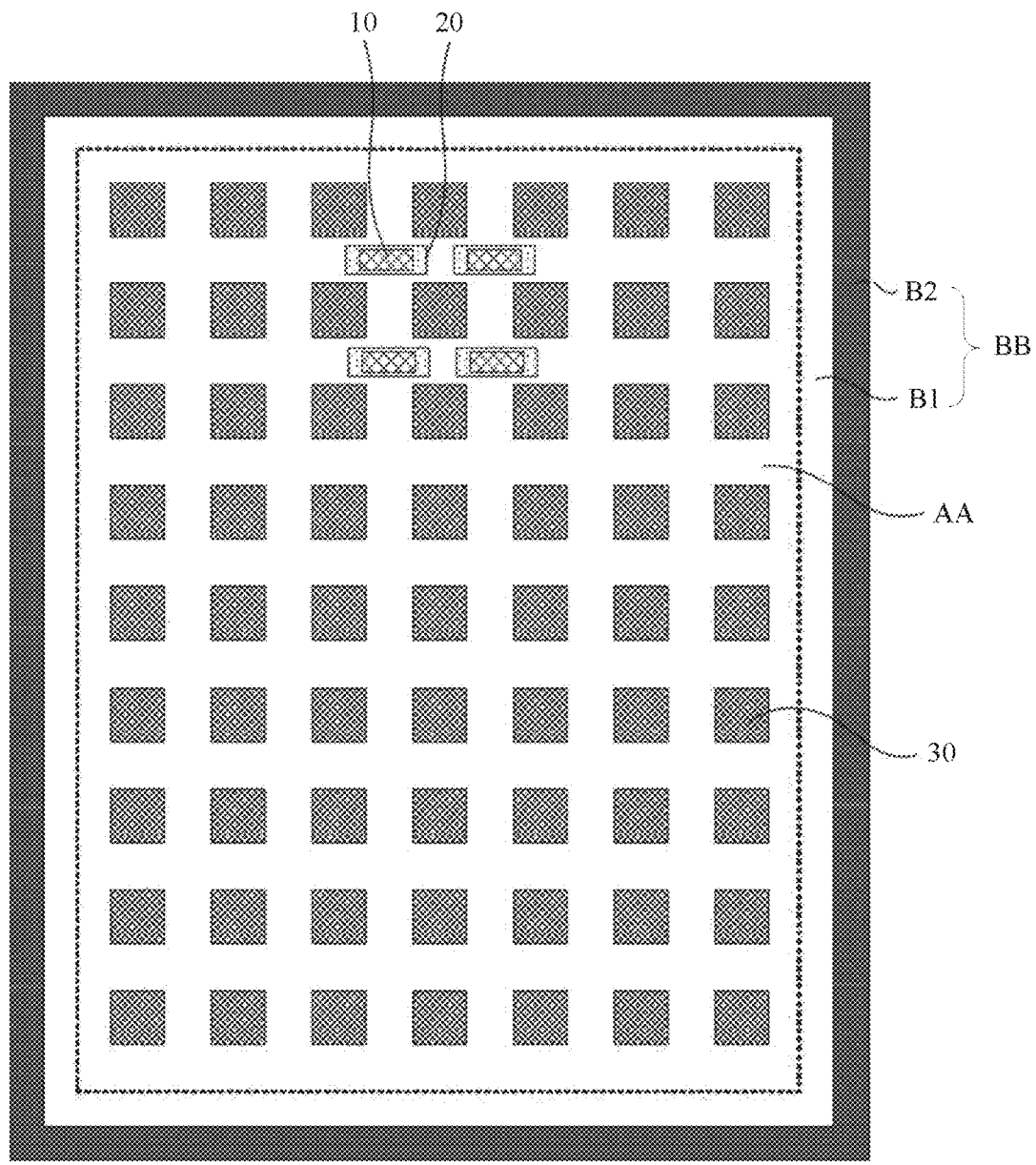
FIG. 8 is a schematic diagram of another display panel according to an embodiment of this application.
Figure 9:
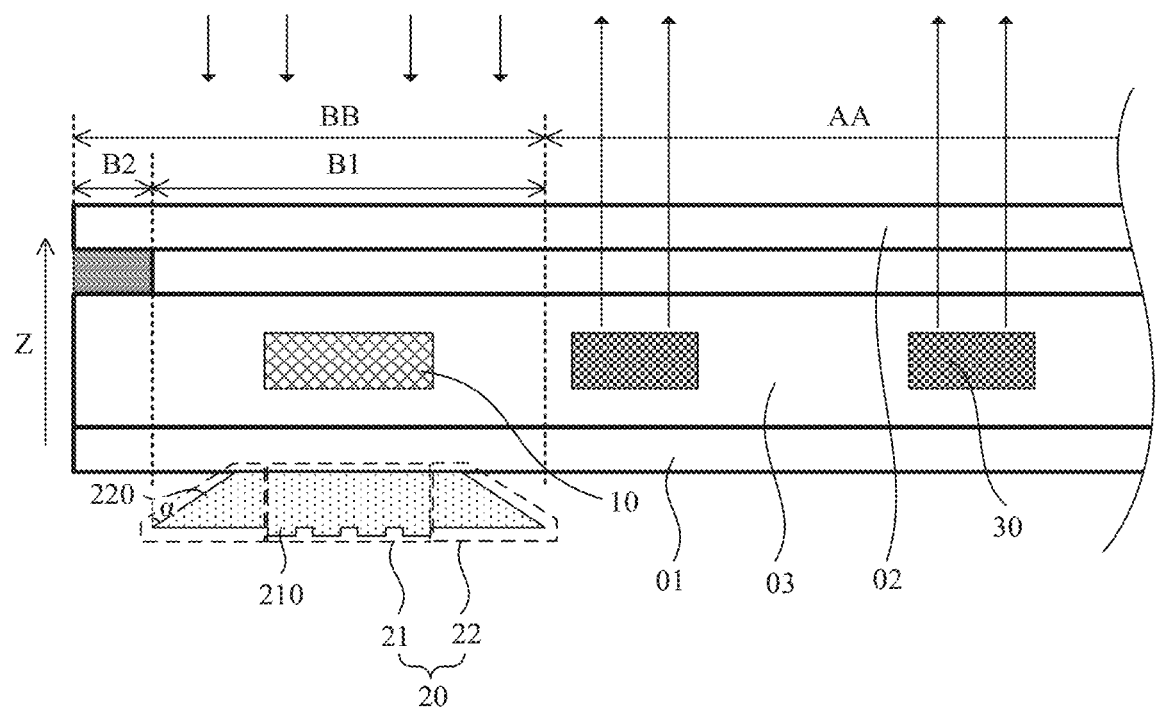
FIG. 9 is a schematic cross-sectional diagram corresponding to FIG. 7.
Figure 10:
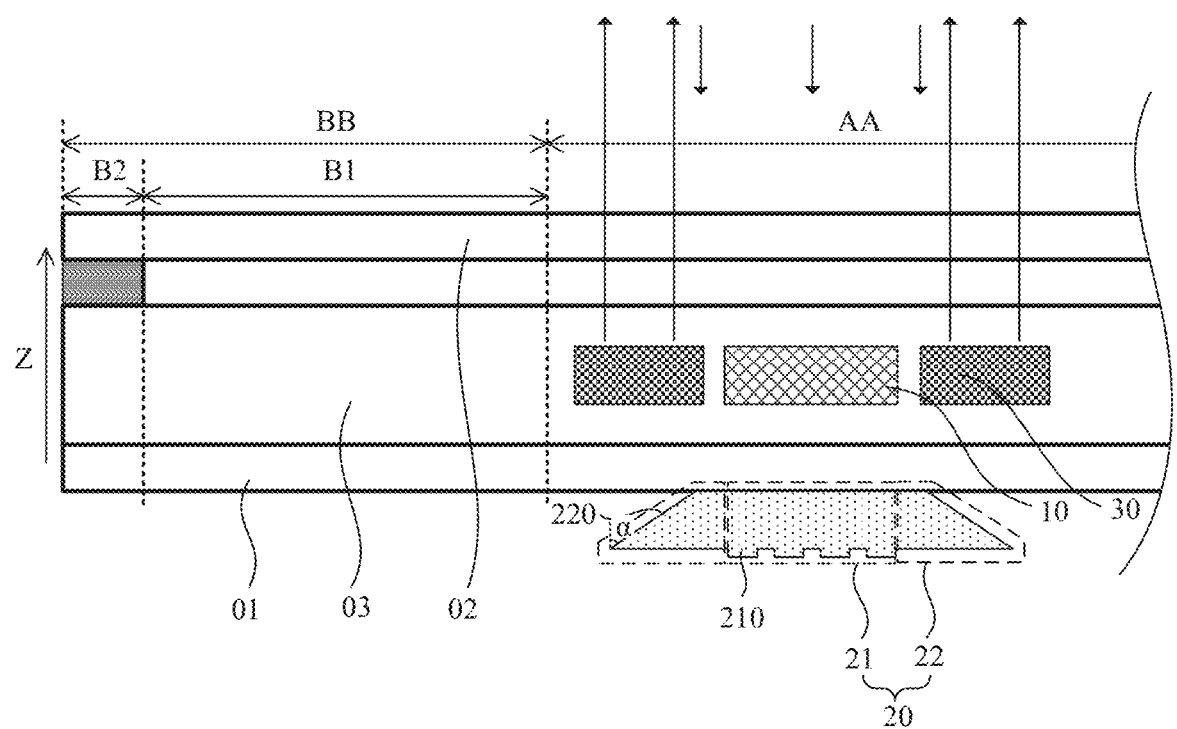
FIG. 10 is a schematic cross-sectional diagram corresponding to FIG. 8.

FIG. 7 is a schematic diagram of a display panel according to an embodiment of this application. FIG. 8 is a schematic diagram of another display panel according to an embodiment of this application. FIG. 9 is a schematic cross-sectional diagram corresponding to FIG. 7. FIG. 10 is a schematic cross-sectional diagram corresponding to FIG. 8.

An embodiment of this application further provides a display panel. As shown in FIG. 7 to FIG. 10, the display panel provided in this embodiment of this application includes a display area AA and a non-display area BB, and the non-display area BB surrounds the display area AA. The display area AA includes a plurality of light-emitting sub-pixels 30, and the area is mainly configured to perform light-emitting display. The non-display area BB may further include a black frame area B2 and a middle area B1 located between the black frame area B2 and the display area AA.

At least one of the display area AA and the non-display area BB includes at least one optical sensor 10 and at least one light guide plate 20, and the light guide plate 20 and the optical sensor 10 are arranged in a thickness direction Z of the display panel. In other words, the display panel includes at least one optical sensor 10 and at least one light guide plate 20, and the at least one optical sensor 10 and the at least one light guide plate 20 are disposed in an area in which at least one of the display area AA and the non-display area BB is located.

For example, as shown in FIG. 7 and FIG. 9, the optical sensor 10 and the light guide plate 20 are disposed in the non-display area. In this case, the optical sensor 10 may preferably serve as a device for ambient light detection or proximity light detection, to avoid impact of light emitted by the display area AA on ambient light detection or proximity light detection.

For example, as shown in FIG. 8 and FIG. 10, the optical sensor 10 and the light guide plate 20 are disposed in the display area AA. To be specific, the display area AA includes the optical sensor 10, and the optical sensor 10 located in the display area AA may be configured to perform biometric feature recognition, for example, fingerprint recognition. In a biometric feature recognition process, the light-emitting subpixel 30 in the display area AA may serve as a detection light source for biometric feature recognition, and emit detection light to a biological object. Detection light reflected by the biological object is incident on the optical sensor 10 and the light guide plate 20, to implement biometric feature recognition.

For example, some optical sensors 10 and some light guide plates 20 are disposed in the non-display area BB, and the other optical sensors 10 and the other light guide plates 20 are disposed in the display area AA.

In addition, when at least some optical sensors 10 and at least some light guide plates 20 are disposed in the non-display area BB, the optical sensors 10 and the light guide plates 20 may be disposed in the middle area B1 as shown in FIG. 7 and FIG. 9, or may be disposed in the black frame area B2, or may be partially disposed in the middle area B1 and partially disposed in the black frame area B2.

The optical sensor 10 receives an optical signal from a first side of the display panel, and the light guide plate 20 is disposed on a side that is of the optical sensor 10 and that is away from the first side. For example, as shown in FIG. 9 and FIG. 10, a side of a light-emitting surface of the display panel is the first side of the display panel. In this case, the optical sensor 10 receives an optical signal transmitted from the side of the light-emitting surface of the display panel, and the light guide plate 20 is disposed on a side that is of the optical sensor 10 and that is away from the light-emitting surface of the display panel.

In this embodiment of this application, the optical signal is a signal that is to be transmitted to the optical sensor 10 and that is to be converted by the optical sensor 10 into an electrical signal, to implement optical feature recognition, and may be specifically near-infrared light, infrared light, visible light, ultraviolet light, or the like.

The light guide plate 20 includes a first part 21 and a second part 22. To be specific, the light guide plate 20 is a continuous whole, and the light guide plate 20 is divided into the first part 21 and the second part 22 based on different locations of the light guide plate 20 and the corresponding optical sensor 10.

The second part 22 does not overlap the optical sensor 10 in the thickness direction Z of the display panel. In other words, the second part 22 is a part protruding from the optical sensor 10. In addition, an included angle between at least a partial side edge 220 of the second part 22 and the thickness direction Z of the display panel is $\alpha$, and $\alpha > 0°$. The second part 22 is configured to receive an optical signal that is from the first side of the display panel and that is around the optical sensor 10. In addition, a tilt angle of the partial side edge 220 of the second part 22 is set to match a refractive index of the light guide plate 20, to convert the received optical signal into light that may be totally reflected inside the light guide plate 20.

The light guide plate 20 is a material with a high refractive index. For example, when the light guide plate 20 is made of an acrylic material, the refractive index of the light guide plate 20 is 1.491. Based on a refractive index formula, when an optical signal that is incident on the light guide plate 20 is totally reflected inside the light guide plate 20, an incident angle of the optical signal needs to be greater than 41.8°. Based on this, the tilt angle of the at least partial side edge 220 of the second part 22 may be set.

The first part 21 at least partially overlaps the optical sensor 10 in the thickness direction Z of the display panel. In other words, at least a part of the first part 21 is blocked by the optical sensor 10. In addition, a surface that is of the first part 21 and that is away from the optical sensor 10 is a first protrusion structure 210. The first protrusion structure 210 may change a transmission path of light that is totally reflected inside the light guide plate 20. In other words, the first protrusion structure 210 may damage total reflection of the light inside the light guide plate 20, so that the light is emitted by the light guide plate 20. In addition, because the surface that is of the first part 21 and that is away from the optical sensor 10 is provided with the first protrusion structure 210, the optical signal whose transmission path is damaged inside the light guide plate 20 is mainly emitted from a surface that is of the first part 21 and that is close to the optical sensor 10, and mainly arrives at the optical sensor 10.

The first protrusion structure 210 may be specifically a printed white dot or an injection-molded small raised point.

In this embodiment of this application, the second part 22 that protrudes from the optical sensor 10 may receive an optical signal around the optical sensor 10, and enable the optical signal to be totally reflected inside the light guide plate 20. The first part 21 that is blocked by the optical sensor 10 may enable the optical signal inside the light guide plate 20 to be emitted by the light guide plate 20 after a total reflection path of the optical signal inside the light guide plate 20 is changed, and to mainly arrive at the optical sensor 10. In this embodiment of this application, the light guide plate 20 is disposed below the optical sensor 10, and the light guide plate 20 is specially designed, so that intensity of an optical signal received by the optical sensor 10 can be increased, and optical feature recognition precision of the display panel can be increased.

In this embodiment of this application, the display panel integrated with the optical sensor 10 may implement biometric feature recognition (for example, fingerprint recognition or facial recognition), proximity light detection, ambient light detection, or the like.

In this embodiment of this application, in the thickness direction Z of the display panel, the display panel includes a substrate 01, a protective cover 02, and a functional layer 03 located between the substrate 01 and the protective cover 02. The light-emitting subpixel 30 is disposed at the functional layer 03, and a photosensitive device may be integrated into the functional layer 03. The substrate 01 may be a rigid substrate or a flexible substrate.

In addition, the light guide plate 20 may be attached to a side that is of the substrate 01 and that is away from the functional layer 03, or may be attached to a side that is of the protective cover 02 and that is away from the functional layer 03. When an optical signal received by the photosensitive device comes from a side that is of the display panel and that is close to the protective cover 02, the light guide plate 20 may be attached to the side that is of the substrate 01 and that is away from the functional layer 03. When an optical signal received by the photosensitive device comes from a side that is of the display panel and that is close to the substrate 01, the light guide plate 20 may be attached to the side that is of the protective cover 02 and that is away from the functional layer 03.

In an implementation, as shown in FIG. 9 and FIG. 10, a display manner of the display panel is top emission, and the photosensitive device receives the optical signal on the side of the light-emitting surface of the display panel. In other words, a side on which the protective cover 02 is located is the light-emitting surface of the display panel, and the photosensitive device receives the optical signal from the side of the light-emitting surface of the display panel. In this case, the light guide plate 20 may be attached to the substrate 01.

Figure 11:
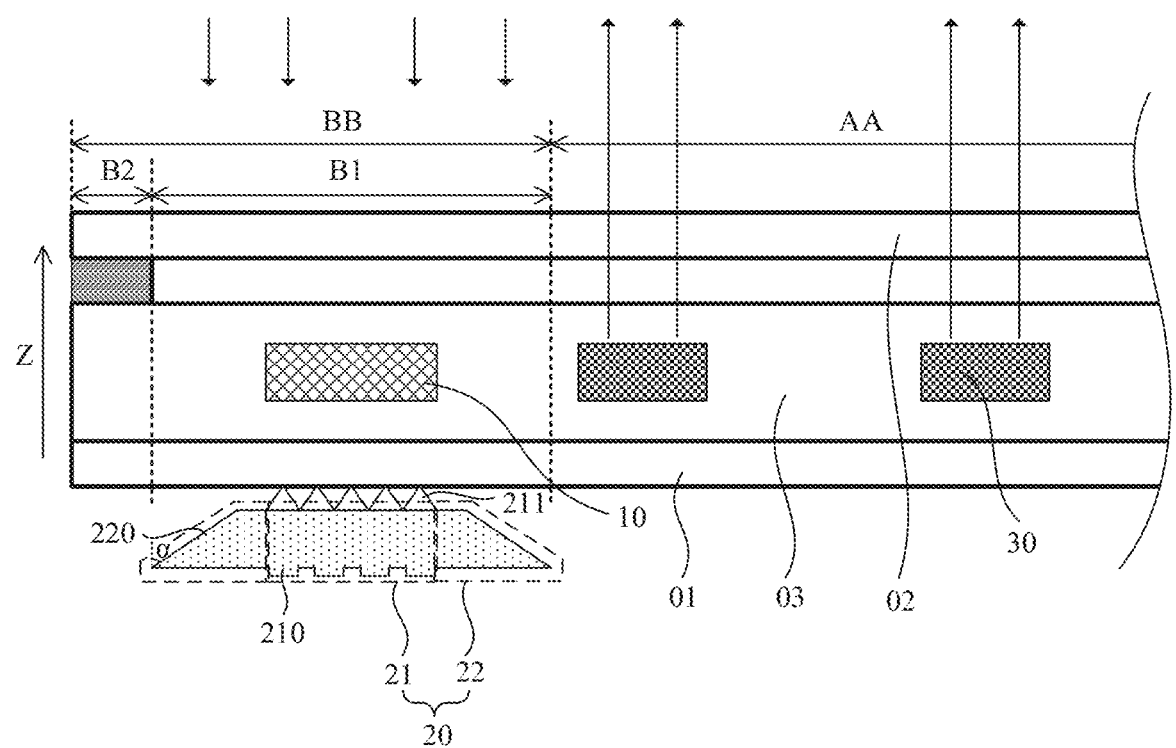
FIG. 11 is another schematic cross-sectional diagram corresponding to FIG. 7.
Figure 12:
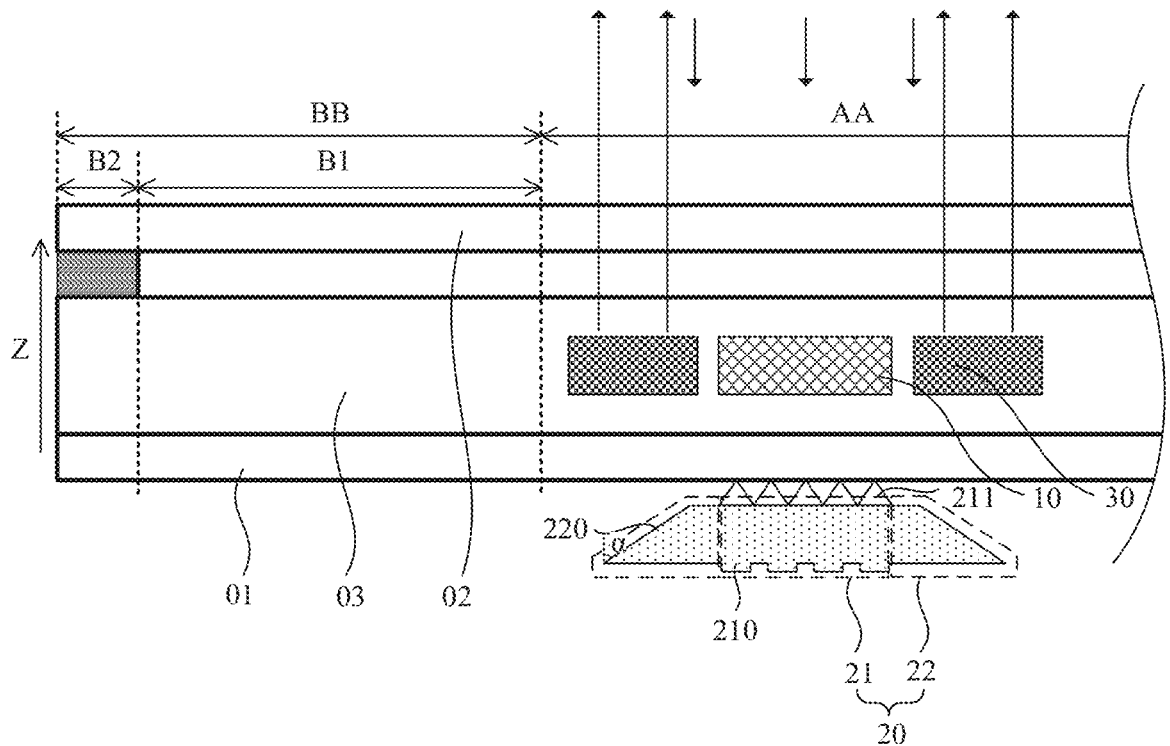
FIG. 12 is another schematic cross-sectional diagram corresponding to FIG. 8.

FIG. 11 is another schematic cross-sectional diagram corresponding to FIG. 7. FIG. 12 is another schematic cross-sectional diagram corresponding to FIG. 8.

In an embodiment of this application, as shown in FIG. 11 and FIG. 12, at least two second protrusion structures 211 are included on a side that is of the first part 21 and that is close to the optical sensor 10. Large-angle light exists in an optical signal that is transmitted inside the light guide plate 20 and whose total reflection path is damaged by the first protrusion structure 210. The second protrusion structure 211 may change an emission angle of the large-angle light, so that more light emitted by the light guide plate 20 is incident on the optical sensor 10.

A specific structure, material, and disposing manner of the second protrusion structure 211 may be the same as a specific structure and disposing manner of the second protrusion structure 211 in the module integrated with the optical sensor 10 in the foregoing embodiments, and details are not described herein again.

Figure 13:
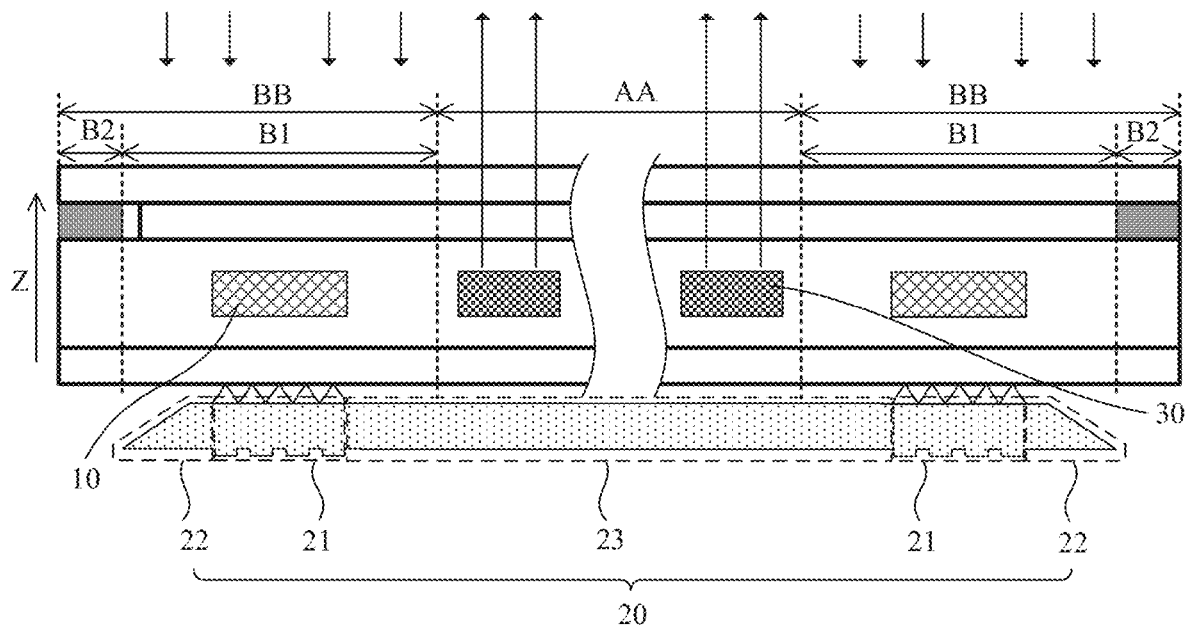
FIG. 13 is a schematic cross-sectional diagram of a display panel according to an embodiment of this application.

FIG. 13 is a schematic cross-sectional diagram of a display panel according to an embodiment of this application.

In an embodiment of this application, as shown in FIG. 13, a non-display area BB includes a plurality of optical sensors 10, and in a thickness direction Z of the display panel, a light guide plate 20 covers at least two optical sensors 10 located on two opposite sides of a display area AA. In other words, at least one optical sensor 10 is disposed in each of non-display areas BB located on two opposite sides of the display area AA, and optical devices respectively disposed in the non-display areas BB on the two opposite sides may be covered by a same light guide plate 20.

In this embodiment, the light guide plate 20 further includes a third part 23, and at least a part of the third part 23 is located in the display area AA. In the thickness direction Z of the display panel, a first protrusion structure 210 does not overlap the third part 23 located in the display area AA. In other words, the first protrusion structure 210 is not disposed on a part that is of the light guide plate 20 and that is located in the display area AA, so that an optical signal received by the light guide plate 20 can be prevented from being emitted by the light guide plate 20 in the display area AA. A waste caused when the optical signal received by the light guide plate 20 is not used for optical feature recognition is avoided. In addition, impact exerted, on a normal display picture in the display area AA, when an optical signal used for optical feature recognition is emitted from the display area AA is avoided.

In addition, a second protrusion structure 211 does not overlap the third part 23.

It can be understood that when the light guide plate 20 covers the at least two optical sensors 10, the light guide plate 20 that covers the at least two optical sensors 10 includes at least two first parts 21, and one optical sensor 10 corresponds to one first part 21.

In an implementation of this embodiment, the display panel includes one light guide plate 20, and the light guide plate 20 may be an entire-surface structure that covers all optical sensors 10.

In another embodiment of this application, the display panel includes a plurality of optical sensors 10 and a plurality of light guide plates 20, and the optical sensors 10 and the light guide plates 20 are disposed in a one-to-one correspondence.

In an implementation of this application, in the optical sensor 10 and the light guide plate 20 that are correspondingly disposed, a projection of a second part 22 surrounds a projection of the optical sensor 10 in the thickness direction Z of the display panel, and an included angle between each side edge 220 of the second part 22 and the thickness direction Z of the display panel is greater than 0°. In other words, all optical signals around the optical sensor 10 may arrive at the light guide plate 20, and are received and used by the light guide plate 20, to effectively increase a signal quantity of optical signals received by the optical sensor 10.

In still another embodiment of this application, the display panel includes a plurality of optical sensors 10 and a plurality of light guide plates 20. In addition, at least one of the light guide plates 20 covers at least two optical sensors 10 in a thickness direction Z of the display panel, and the at least one of the light guide plates 20 is disposed in a one-to-one correspondence with the optical sensors 10.

Figure 14:
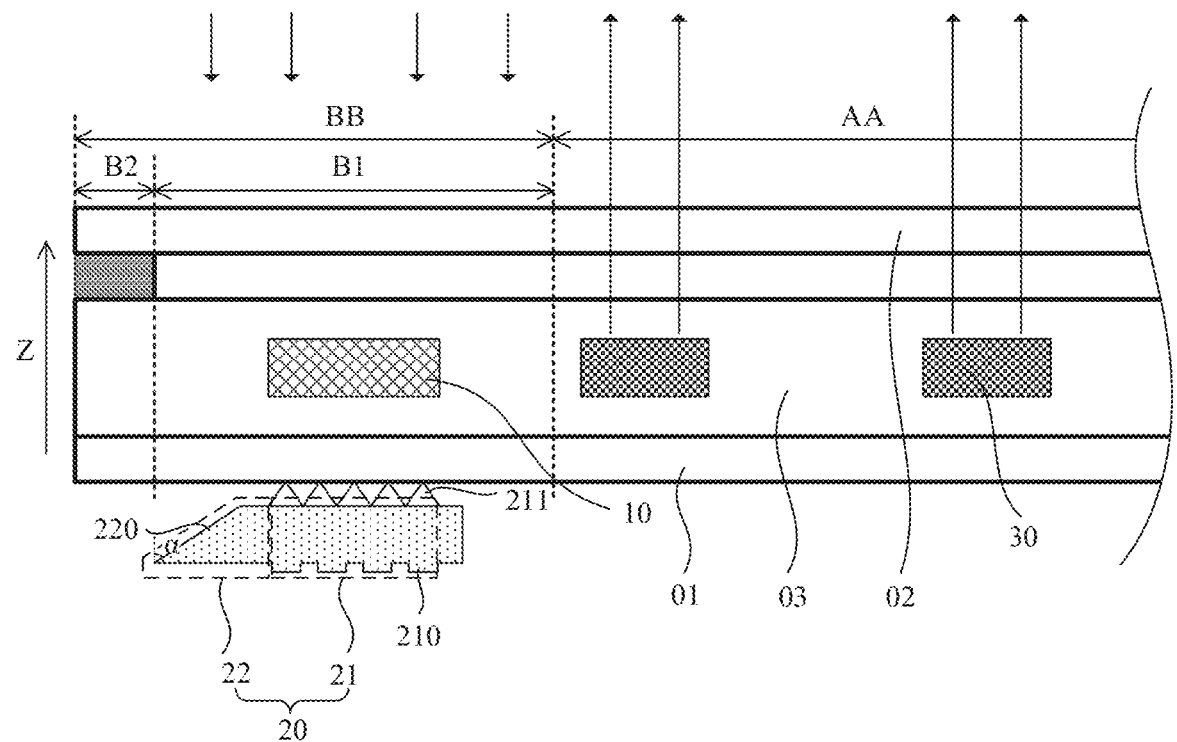
FIG. 14 is a schematic cross-sectional diagram of another display panel according to an embodiment of this application.

FIG. 14 is a schematic cross-sectional diagram of another display panel according to an embodiment of this application.

In an embodiment of this application, as shown in FIG. 14, a non-display area BB includes at least one optical sensor 10 and at least one light guide plate 20, and a side edge that is of the light guide plate 20 disposed in the non-display area BB and that is close to a display area AA is parallel to a thickness direction of the display panel. In other words, in a process error range, an included angle between the thickness direction Z of the display panel and the side edge close to the display area AA in side edges of the light guide plate 20 disposed in the non-display area BB is basically 0°. For example, as shown in FIG. 14, a right side edge of the light guide plate 20 disposed in the non-display area BB is a side edge close to the display area AA, and the side edge is basically parallel to the thickness direction Z of the display panel.

Therefore, when light that is emitted by the display panel and that is used to perform light-emitting display arrives at the non-display area BB, a case in which the light is emitted to the optical sensor 10 after being totally reflected inside the light guide plate 20 basically does not occur, to avoid impact of the light for light-emitting display in the display area AA on optical feature recognition accuracy of the non-display area BB.

Figure 15:
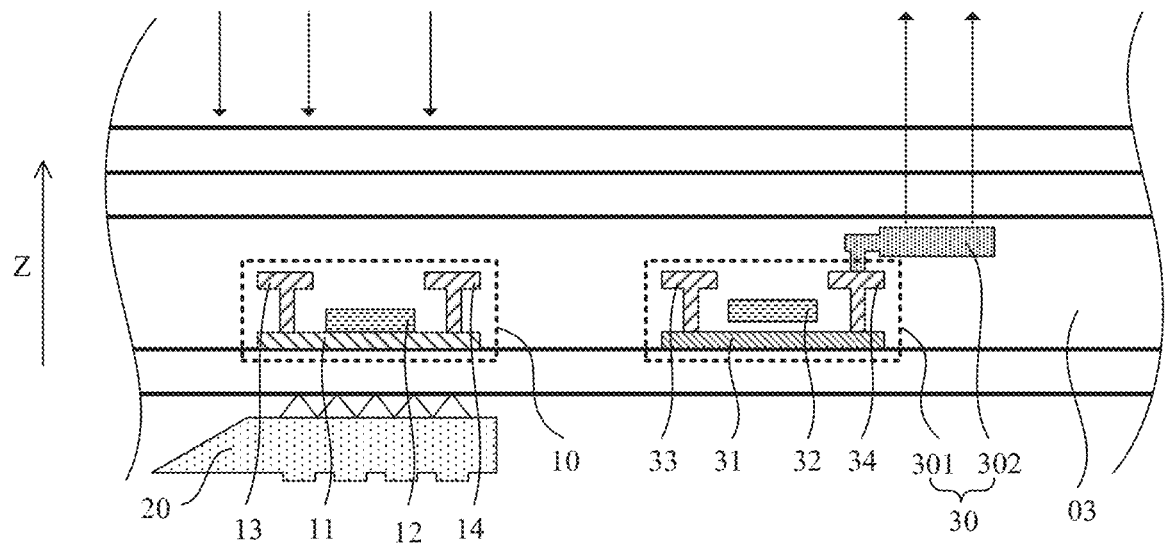
FIG. 15 is a schematic cross-sectional diagram of still another display panel according to an embodiment of this application.

FIG. 15 is a schematic cross-sectional diagram of still another display panel according to an embodiment of this application.

In an embodiment of this application, as shown in FIG. 15, an optical sensor 10 is a thin film transistor device, and the optical sensor 10 includes an active layer 11, a gate 12, a source 13, and a drain 14. The active layer 11 may generate different carrier concentrations based on a quantity of received optical signals, so that the optical sensor 10 generates different electrical signals, to implement optical feature recognition. The active layer 11 may be specifically at least one of an amorphous silicon film, a polycrystalline silicon film, or a metal oxide semiconductor layer.

In an implementation of this embodiment, the gate 12 of the thin film transistor device that serves as the optical sensor 10 is located on a side that is of the optical sensor 10 and that is away from a light guide plate 20. In other words, the gate 12 of the thin film transistor device that serves as the optical sensor 10 is located on a side that is of the active layer and that receives an optical signal. In this case, the gate 12 blocks the optical signal, and a quantity of optical signals received by the optical sensor 10 is affected. In this implementation, an inventive concept of this application is used. To be specific, the light guide plate 20 provided in any one of the foregoing embodiments is disposed below the optical sensor 10, to significantly increase a quantity of optical signals of a structure of the optical sensor 10.

Further, the thin film transistor device that serves as the optical sensor 10 may be manufactured at a same layer as at least a part of a structure of a thin film transistor device 301 in a light-emitting subpixel 30. The thin film transistor device 301 in the light-emitting subpixel 30 may provide a light emitting signal for a light emitting device 302 in the light-emitting subpixel 30. As shown in FIG. 15, the gate 12 of the thin film transistor device that serves as the optical sensor 10 may be disposed at a same layer as the gate 32 of the thin film transistor device 301 in the light-emitting subpixel 30, and the source 13 and the drain 14 of the thin film transistor device that serves as the optical sensor 10 may be disposed at a same layer as the source 33 and the drain 34 of the thin film transistor device 301 in the light-emitting subpixel 30.

The active layer 11 of the thin film transistor device that serves as the optical sensor 10 and the active layer 31 of the thin film transistor device 301 in the light-emitting subpixel 30 may be disposed at a same layer or disposed at different layers. In addition, in this embodiment of this application, the gate 12 of the thin film transistor device that serves as the optical sensor 10 may be disposed in contact with the active layer 11 of the thin film transistor device. In other words, no insulation layer is disposed between the gate 12 and the active layer 11.

In another embodiment of this application, the optical sensor 10 may alternatively be at least one of an organic photosensitive device and a photodiode device.

Figure 16:
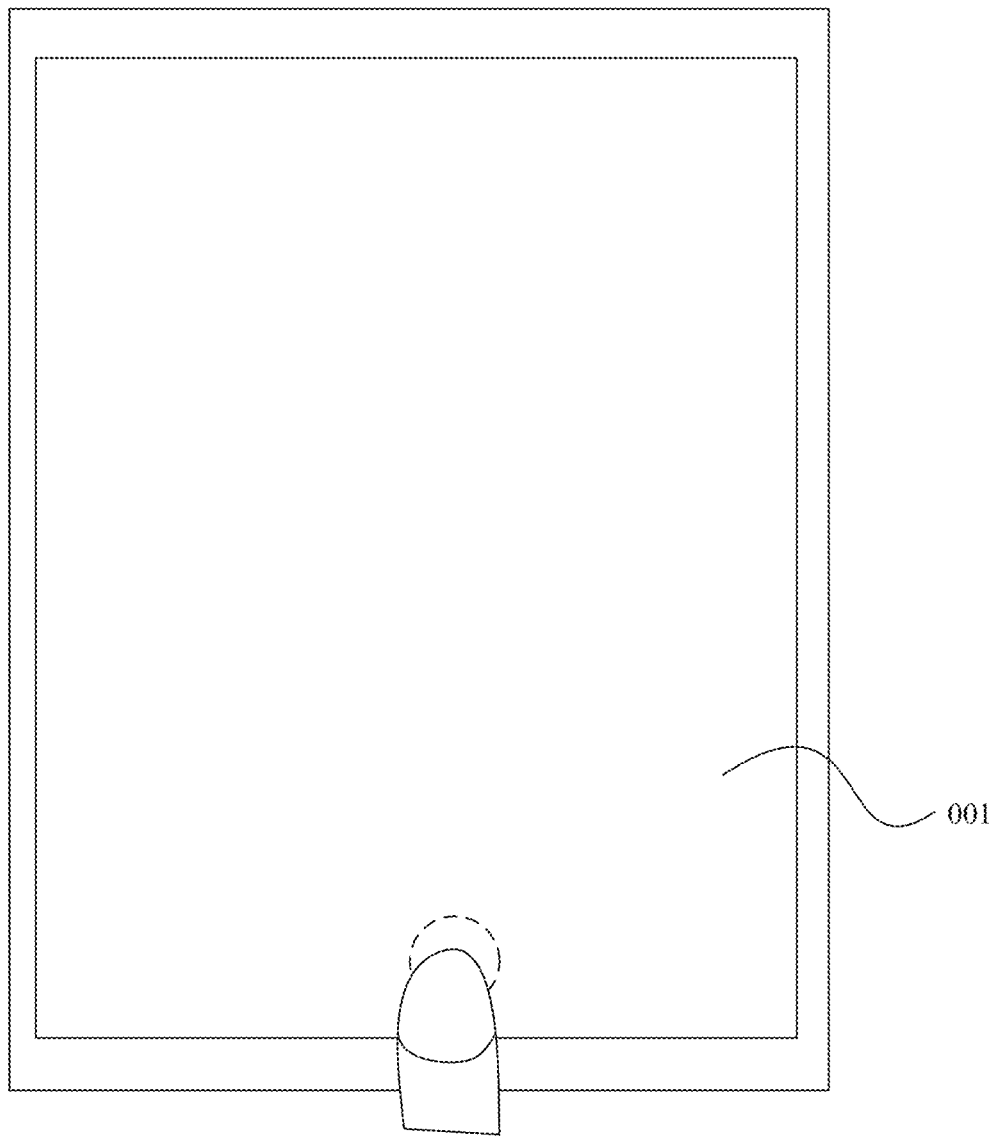
FIG. 16 is a schematic diagram of a display apparatus according to an embodiment of this application.

This application further provides a display apparatus. FIG. 16 is a schematic diagram of a display apparatus according to an embodiment of this application. In an embodiment of this application, as shown in FIG. 16, the display apparatus includes a display panel 001 provided in any embodiment of this application. A specific structure of the display panel 001 has been described in detail in the foregoing embodiments. Details are not described herein again. Certainly, the display apparatus shown in FIG. 16 is provided only for schematic illustration. For example, the display apparatus may be any display apparatus with a display function, for example, a mobile phone, a tablet computer, a notebook computer, an E-book, a television, or a smartwatch; or the display panel.

The foregoing descriptions are merely specific implementations of this application, and any change or replacement readily figured out by a person skilled in the art within the technical scope disclosed in this application shall fall within the protection scope of this application. The protection scope of this application shall be subject to the protection scope of the claims.

What is claimed is:

1. A display apparatus, comprising:
   a display panel, comprising:
      a display area; and
      a non-display area that surrounds the display area,
      wherein at least one of the display area and the non-display area comprises:
         at least one optical sensor configured to receive an optical signal from a first side of the display panel; and
         at least one light guide plate comprising a first part and a second part, wherein the light guide plate is disposed on a side of the optical sensor that is away from the first side, wherein the light guide plate and the optical sensor are arranged in a thickness direction of the display panel, and wherein the first part at least partially overlaps the optical sensor in the thickness direction, and the second part does not overlap the optical sensor in the thickness direction,
         wherein a surface of the first part that is away from the optical sensor is a first protrusion structure, and an included angle between at least a partial side edge of the second part and the thickness direction of the display panel is greater than 0°.

2. The display apparatus of claim 1, wherein a side of the first part close to the optical sensor comprises at least two second protrusion structures.

3. The display apparatus of claim 1, wherein the non-display area comprises a plurality of optical sensors, wherein the light guide plate covers at least two optical sensors located on two opposite sides of the display area in the thickness direction of the display panel, wherein the light guide plate further comprises a third part at least partially located in the display area, and wherein the first protrusion structure does not overlap the third part located in the display area in the thickness direction of the display panel.

4. The display apparatus of claim 1, further comprising a plurality of optical sensors and a plurality of light guide plates, wherein the optical sensors and the light guide plates are disposed in a one-to-one correspondence.

5. A module, comprising:
   at least one optical sensor configured to receive an optical signal from a first side of the module; and
   at least one light guide plate comprising a first part and a second part, wherein the light guide plate is disposed on a side of the optical sensor that is away from the first side, wherein the light guide plate and the optical sensor are arranged in a thickness direction of the module, and wherein the first part at least partially overlaps the optical sensor in the thickness direction, and the second part does not overlap the optical sensor in the thickness direction,
   wherein a surface of the first part that is away from the optical sensor is a first protrusion structure, and an included angle between at least a partial side edge of the second part and the thickness direction of the module is greater than 0°.

6. The module of claim 5, wherein a side of the first part close to the optical sensor comprises at least two second protrusion structures.

7. The module of claim 5, further comprising a plurality of optical sensors, wherein the light guide plate covers at least two optical sensors in the thickness direction of the module, wherein the light guide plate further comprises a third part that covers an area between the at least two optical sensors in the thickness direction of the module, and wherein the first protrusion structure does not overlap the third part in the thickness direction of the module.

8. The module of claim 5, further comprising a plurality of optical sensors and a plurality of light guide plates, wherein the optical sensors and the light guide plates are disposed in a one-to-one correspondence.

9. The module of claim 8, wherein for each optical sensor and light guide plate that are correspondingly disposed, a projection of the second part of the light guide plate surrounds a projection of the optical sensor in the thickness direction of the module, and wherein an included angle between each side edge of the second part and the thickness direction of the module is greater than 0°.

10. The module of claim 5, wherein the optical sensor is a thin film transistor device, and a gate of the thin film transistor device is located on a side of the optical sensor away from the light guide plate.

11. The module of claim 5, wherein the optical sensor is at least one of an organic photosensitive device and a photodiode device.

12. A display panel, comprising:
a display area; and
a non-display area that surrounds the display area,
wherein at least one of the display area and the non-display area comprises:
at least one optical sensor configured to receive an optical signal from a first side of the display panel; and
at least one light guide plate comprising a first part and a second part, wherein the light guide plate is disposed on a side of the optical sensor that is away from the first side, wherein the light guide plate and the optical sensor are arranged in a thickness direction of the display panel, and wherein the first part at least partially overlaps the optical sensor in the thickness direction, and the second part does not overlap the optical sensor in the thickness direction,
wherein a surface of the first part that is away from the optical sensor is a first protrusion structure, and an included angle between at least a partial side edge of the second part and the thickness direction of the display panel is greater than 0°.

13. The display panel of claim 12, wherein a side of the first part close to the optical sensor comprises at least two second protrusion structures.

14. The display panel of claim 12, wherein the non-display area comprises a plurality of optical sensors, wherein the light guide plate covers at least two optical sensors located on two opposite sides of the display area in the thickness direction of the display panel, wherein the light guide plate further comprises a third part at least partially located in the display area, and wherein the first protrusion structure does not overlap the third part located in the display area in the thickness direction of the display panel.

15. The display panel of claim 12, further comprising a plurality of optical sensors and a plurality of light guide plates, wherein the optical sensors and the light guide plates are disposed in a one-to-one correspondence.

16. The display panel of claim 15, wherein in the for each optical sensor and light guide plate that are correspondingly disposed, a projection of the second part of the light guide plate surrounds a projection of the optical sensor in the thickness direction of the display panel, and wherein an included angle between each side edge of the second part and the thickness direction of the display panel is greater than 0°.

17. The display panel of claim 12, wherein the non-display area comprises at least one optical sensor and at least one light guide plate, and wherein a side edge that is of the light guide plate disposed in the non-display area that is close to the display area is parallel to the thickness direction of the display panel.

18. The display panel of claim 12, wherein the display area comprises the optical sensor, and the optical sensor located in the display area is configured to perform biometric feature recognition.

19. The display panel of claim 12, wherein the optical sensor is a thin film transistor device, and a gate of the thin film transistor device is located on a side is of an active layer that is away from the light guide plate.

20. The display panel of claim 12, wherein the optical sensor is at least one of an organic photosensitive device and a photodiode device.

* * * * *